US005670913A

United States Patent [19]

Garcia Palancar

[11] Patent Number: 5,670,913
[45] Date of Patent: Sep. 23, 1997

[54] PHASE LOCKED LOOP CIRCUIT WITH FALSE LOCKING DETECTOR AND A LOCK ACQUISITION SWEEP

[75] Inventor: Francisco Manuel Garcia Palancar, Camarma de Esteruelas, Spain

[73] Assignee: Alcatel N.V., Netherlands

[21] Appl. No.: 622,745

[22] Filed: Mar. 27, 1996

[30] Foreign Application Priority Data

Mar. 31, 1995 [ES] Spain ................... P 9500648

[51] Int. Cl.$^6$ ............... H03L 7/095; H03L 7/12
[52] U.S. Cl. ............... 331/4; 331/1 A; 331/8; 331/14; 331/17; 331/25; 331/DIG. 2; 327/157; 375/376
[58] Field of Search ............... 331/1 A, 4, 8, 331/11, 12, 14, 15, 17, 25, DIG. 2; 327/156–159; 360/29, 41, 51; 375/376; 329/307, 309

[56] References Cited

U.S. PATENT DOCUMENTS

| | | | |
|---|---|---|---|
| 3,909,735 | 9/1975 | Anderson et al. | 331/DIG. 2 X |
| 4,087,628 | 5/1978 | Sanders et al. | 331/DIG. 2 X |
| 4,100,503 | 7/1978 | Lindsey et al. | 331/DIG. 2 X |
| 4,213,096 | 7/1980 | Daniel, Jr. | 331/DIG. 2 X |
| 4,297,650 | 10/1981 | Shinmyo | 331/DIG. 2 X |
| 4,590,602 | 5/1986 | Wolaver | 331/DIG. 2 X |
| 5,012,494 | 4/1991 | Lai et al. | 375/120 |
| 5,485,484 | 1/1996 | Williams et al. | 331/DIG. 2 X |

FOREIGN PATENT DOCUMENTS

| | | |
|---|---|---|
| 56-35561 | 4/1981 | Japan . |
| 6132818 | 5/1994 | Japan . |
| 2280555 | 2/1995 | United Kingdom . |

OTHER PUBLICATIONS

"Monolithic Chip Retimes Data at 622 Mb/s" B. Lai et al, *Microwaves and RF*, vol.31, No.3, Mar. 1, 1992, pp. 202–205.
Patent Abstract of Japan, vol. 5, No. 91 (E–061) Jun. 13, 1981 & JP–A–56 035561 (Toshiba Corp.).
Patent Abstract of Japan, vol. 18, No. 425 (E–1590) Aug. 9, 1994 & JP–A–06 132818 (Fujitsu Ltd.).

*Primary Examiner*—David Mis
*Attorney, Agent, or Firm*—Ware, Fressola, Van Der Sluys & Adolphson LLP

[57] ABSTRACT

Based on a phase locked loop (PC1, CP1, VCXO) which receives an incoming data signal (DS) and generates a recovered clock signal (RC), in the event that this incoming data signal (DS) includes low frequency cycling, false phase locking can occur, consequently leading to impaired operation; in order to avoid this, according to the invention, there is also included a false locking detector (FLD) to which is applied the incoming data signal (DS) and the recovered clock signal (RC) and the output of, which is added in an adder circuit (ADD) to that coming from the first loop, for producing voltage pulses when both signals are not at the same frequency, provoking a non-locked state. Only when the frequency is correct, does the false locking detector (FLD) not alter loop operation.

3 Claims, 3 Drawing Sheets

PHASE LOCKED LOOP CIRCUIT WITH FALSE LOCKING DETECTOR AND A LOCK ACQUISITION SWEEP

TECHNICAL FIELD

This invention relates to a clock recovery circuit for a non-return to zero (NRZ) type data signal, starting from the data signal itself, and is specially applicable in systems based on time compression multiplexing, TCM, in which half of the frame is employed for transmitting data in one direction, from a central office to a number of network terminating equipments, while the other half is used to transmit data in the other direction, from the network terminating equipments to the central office.

The data signal received in the network terminating equipments, the clock of which it is intended to recover, is only active during one half of the frame.

BACKGROUND OF THE INVENTION

In digital transmission communications systems, it is often necessary to regenerate the waveform of a data signal in order to ensure its integrity.

To do this, the data clock signal is recovered in some way and used to sample the data signal at the moment of least probability of error (in the center of the data cycle).

Frequently the recovery of the clock signal is done by means of a phase-locked loop or PLL circuit which, by comparing the incoming data signal with another generated in a voltage-controlled oscillator, obtains an error signal that is applied to this voltage-controlled oscillator so that both signals maintain a constant phase relationship.

The difficulties in applying this technique depend on the nature of the data signals from which it is intended to recover the clock signal.

In the article "Monolithic chip retimes data at 622 Mb/s" by Benny Lai and Richard C. Walker, published in the review "Microwaves & RF" of March, 1992, on pages 202 to 205, a clock recovery circuit of this type is shown, formed by a phase/frequency detector, a charge pump and a voltage-controlled oscillator with a nominal center frequency of 622 Mb/s with a range of ±10%.

The phase loop so formed permits data clock recovery and, consequently, regeneration of the incoming data signal using a local oscillator which has a nominal frequency very close to that of the data clock signal.

However, when the data signal employs time compression multiplexing, TCM, its spectrum includes, besides a tone whose frequency is equal to the clock frequency, tones which are above and below the actual clock frequency tone by an amount equal to the frame frequency.

In the case where the frame frequency is very low compared to the data clock frequency, these tones lie within the locking range of the PLL, meaning that there is a possibility that the PLL in question erroneously locks in to one of them. This situation would be catastrophic for the receiver and, therefore, for the communications system of which it forms part.

DISCLOSURE OF INVENTION

This invention avoids the above situation and thereby permits the PLL of the clock recovery circuit to lock in only to the frequency corresponding to the received signal data clock.

To do this, the clock recovery circuit which includes a first phase comparator, a first charge pump and a voltage-controlled oscillator performing the functions of a phase-locked loop, also has a false locking detector which receives the incoming data signal and a signal obtained from the voltage-controlled oscillator output signal and which generates, in turn, a signal that is also applied to the voltage-controlled oscillator.

In this way, in the event of false locking occurring, the output signal of the false locking detector takes a value that is added to that produced in the first loop in order to shift the voltage-controlled oscillator frequency from the value at which it was locked to the PLL. If the latter is locked in to the correct value, the false locking detector produces no signal, and so the PLL remains locked in to the existing frequency.

The false locking detector includes a second phase comparator which feeds a second charge pump in such a way that the output signal of this second charge pump is added to that coming from the first charge pump in order to provide a signal for the voltage-controlled oscillator. It also has discharge circuits which discharge, respectively, the capacitors of the first and second charge pumps when the output signal of the second charge pump reaches a determined value close to its saturation value.

The second phase comparator operates in such a way that its output signal takes a non-zero level when the difference in times between the data transitions and the activating edges of the recovered clock signal exceed a determined value.

Thus, in accordance with the invention, in the event of false locking of the clock recovery circuit to a frequency other than that of the data clock, an additional signal is produced by a false locking detector that acts to release the PLL that has been formed. Only when the latter is locked in to the correct frequency will the false locking detector generate no output signal, whereby the PLL remains locked in to this frequency, avoiding in this way the circumstances that would produce incorrect operation of the system.

These and other objects, features and advantages of the present invention will become more apparent in light of the detailed description of a best mode embodiment thereof, as illustrated in the accompanying drawing.

BEST MODE FOR CARRYING OUT THE INVENTION

The implementation described below of a clock recovery circuit according to this invention is applied in an optical fibre digital communications system that employs time compression multiplexing, TCM, techniques, such that one half of the frame is used to transmit data from a central office to a number of network terminating equipments while the other half is used for sending data from the network terminating equipments to the central office.

The bit rate of the data signal, and consequently the frequency of the data clock, is 51.84 Mb/s. The master oscillator is located in the central office and therefore each network terminating equipment has a clock recovery circuit in order to achieve parted reception of the data transmitted by the central office, and to transmit its own data at the rate set by the same clock.

The transmission from the central office to the network terminating equipments, or downstream connection, lasts for 250 µs per frame and has the same duration for the opposite direction, or upstream connection. This results in a frame frequency of 2 kHz.

The network terminating equipments only receive the pad corresponding to the downstream connection, whereby this signal is equivalent to a continuous data signal multiplied by a 2 kHz square wave. In the spectrum of the resulting signal there appears a fundamental tone at 51.84 MHz and, close to this, two other tones at 51.842 MHz and 51.838 MHz, respectively, resulting from the first harmonic of the frame frequency. There also appear the components due to all the odd multiples of the 2 kHz square wave signal.

The clock recovery circuit, as mentioned above, is based on a phase-locked loop, or PLL, with a determined capture range which in this case is very small (around ±0.01%), as the voltage-controlled oscillator included in it is of the crystal type or VCXO with a very high stability. For this reason, all signals higher than the third harmonic of the 2 kHz square wave lie outside the PLL locking range.

Figure 1:
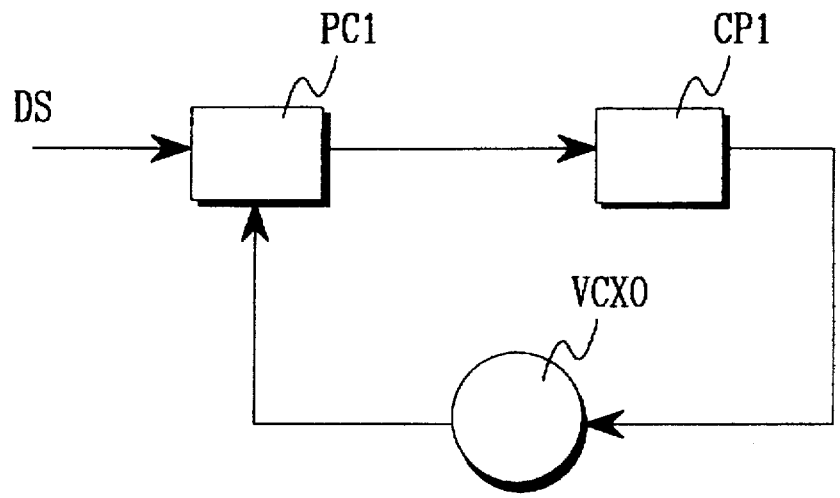
FIG. 1 shows a clock recovery circuit based on a conventional PLL according to the state of the art.

The fundamental PLL is that shown in FIG. 1; it is a digital PLL consisting of a voltage-controlled oscillator VCXO, a first phase comparator PC1 formed by digital logic gates, and a first charge pump CP1 that acts to filter the digital pulses produced by the first phase comparator PC1. The output from this charge pump CP1 is applied to the voltage-controlled oscillator VCXO the nominal center frequency of which, with 2.5 V at its input, is 51.84 MHz, the admissible tolerance for the maximum and minimum input voltages, respectively, being ±0.01%.

Figure 2:
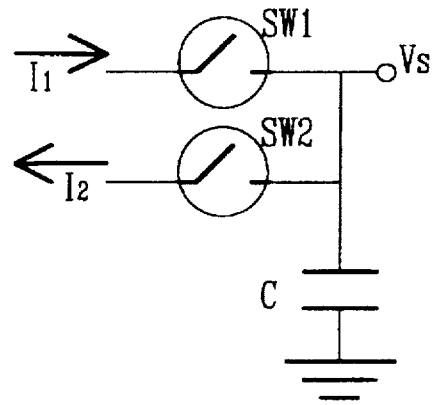
FIG. 2 shows the basic configuration of a charge pump.

FIG. 2 shows the conceptual diagram of a charge pump which is formed by a capacitor C that is charged or discharged with a current I1 or I2, respectively, depending on the state of the switches SW1 and SW2. This is equivalent to an integration or lowpass filtering of digital signals with determined levels.

Figure 4:
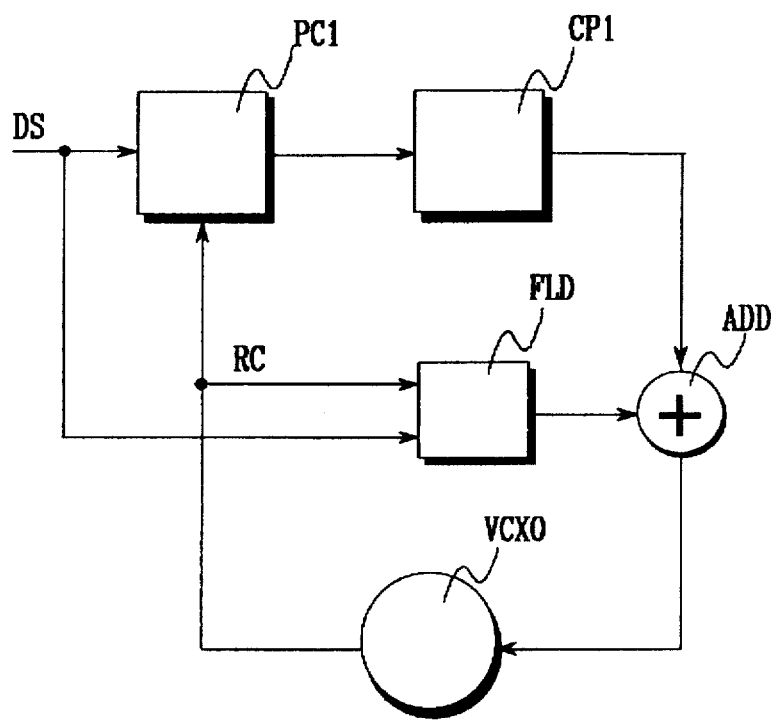
FIG. 4 shows, in accordance with the invention, a clock recovery circuit with a PLL structure which includes a false locking detector.

FIG. 4 shows the block diagram of the clock recovery circuit according to the invention, in which is added, with respect to FIG. 1, a false locking detector FLD which receives the input data signal DS and the recovered clock signal RC and generates an output signal that is added to that coming from the first charge pump CP1, such that a sum signal, obtained in an adder circuit ADD, is applied to the voltage-controlled oscillator VCXO in order to alter its frequency of oscillation.

Figure 3:
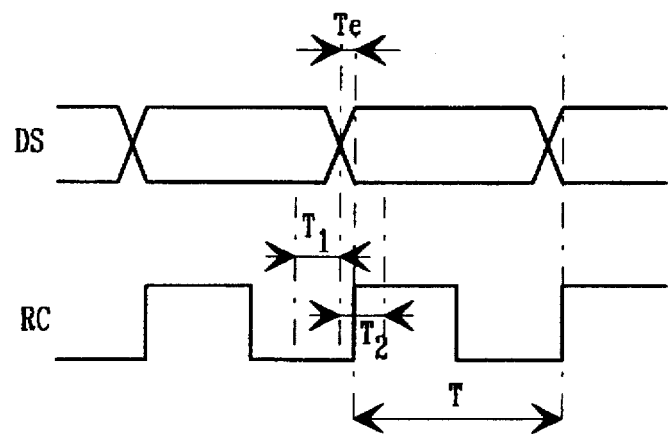
FIG. 3 shows a timing diagram of the data signal received by the clock recovery circuit and of the recovered clock signal.

The operation of the false locking detector FLD is based on determining the difference in time between a transition of the incoming data signal and the closest activating edge of the recovered clock. FIG. 3 shows, in the time domain, the incoming data signal DS and the recovered clock RC, considering the rising edge of the latter as the activating edge.

In this case, the activating edge of the clock reaches the false locking detector FLD with a delay Te with respect to a transition of the incoming data signal DS. If the value of the difference in time Te corresponds to a lag of more than $T_2$ or to a lead of more than $T_1$, the false locking detector FLD provides an output signal in the form of pulses; this is equivalent to considering the loop to be out of lock or in a false lock state. This signal provided by the false locking detector, the DC component of which is finally applied to the voltage-controlled oscillator VCXO, tends to shift the loop away from the frequency at which it had erroneously become locked.

In the opposite case, the false locking detector FLD does not generate any signal since it is considered to be locked in to the correct frequency, and consequently the loop can remain at this frequency.

Figure 5:
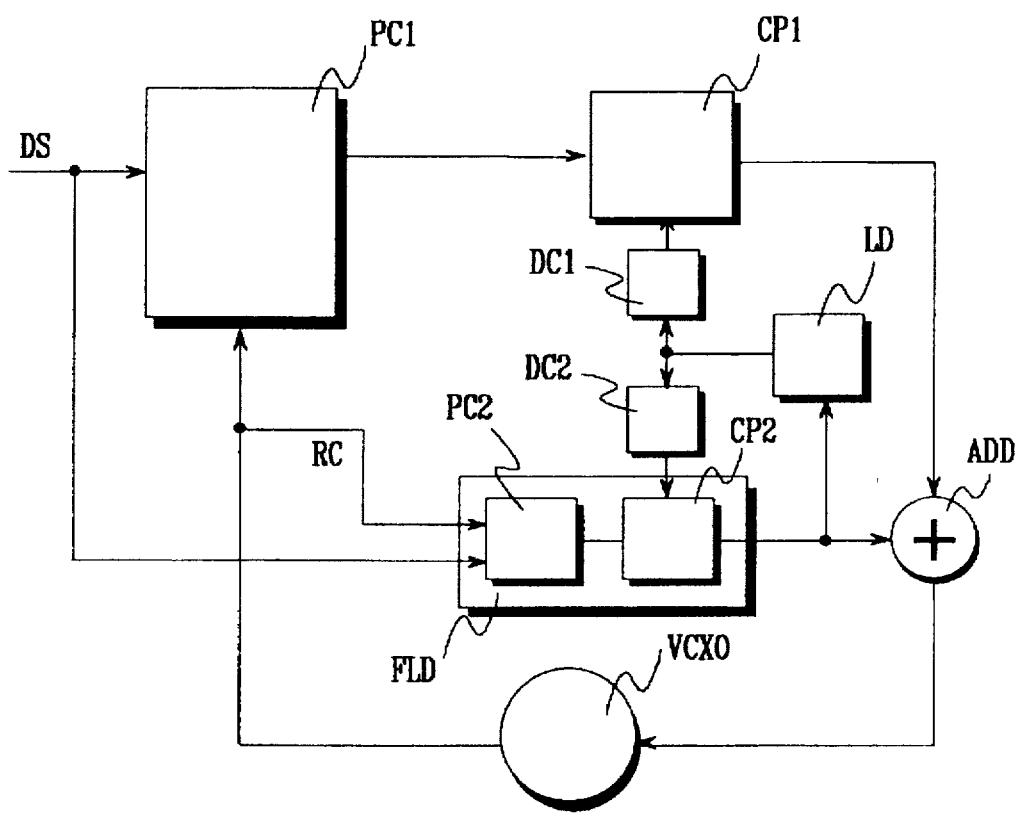
FIG. 5 shows a clock recovery circuit like that above to which has been added a level detector and discharging circuits for the capacitors of the charge pumps.

The false locking detector FLD, as shown in FIG. 5, is formed in turn by a second phase comparator PC2 and a second charge pump CP2. The second phase comparator PC2, as was mentioned above, produces an output consisting of a series of pulses which it sends to the second charge pump CP2 which in this case has only charging current.

To prevent the PLL from becoming blocked in the event of its not being correctly "locked in" and the second charge pump CP2 reaching its maximum value, a level detector LD is attached to its output, the function of which is to activate two discharging circuits DC1, DC2 which discharge the capacitors of the first and second charge pumps CP1, CP2. This permits resetting of the clock recovery circuit, which starts a new sweep in an attempt to lock in to the data clock.

Figure 6:
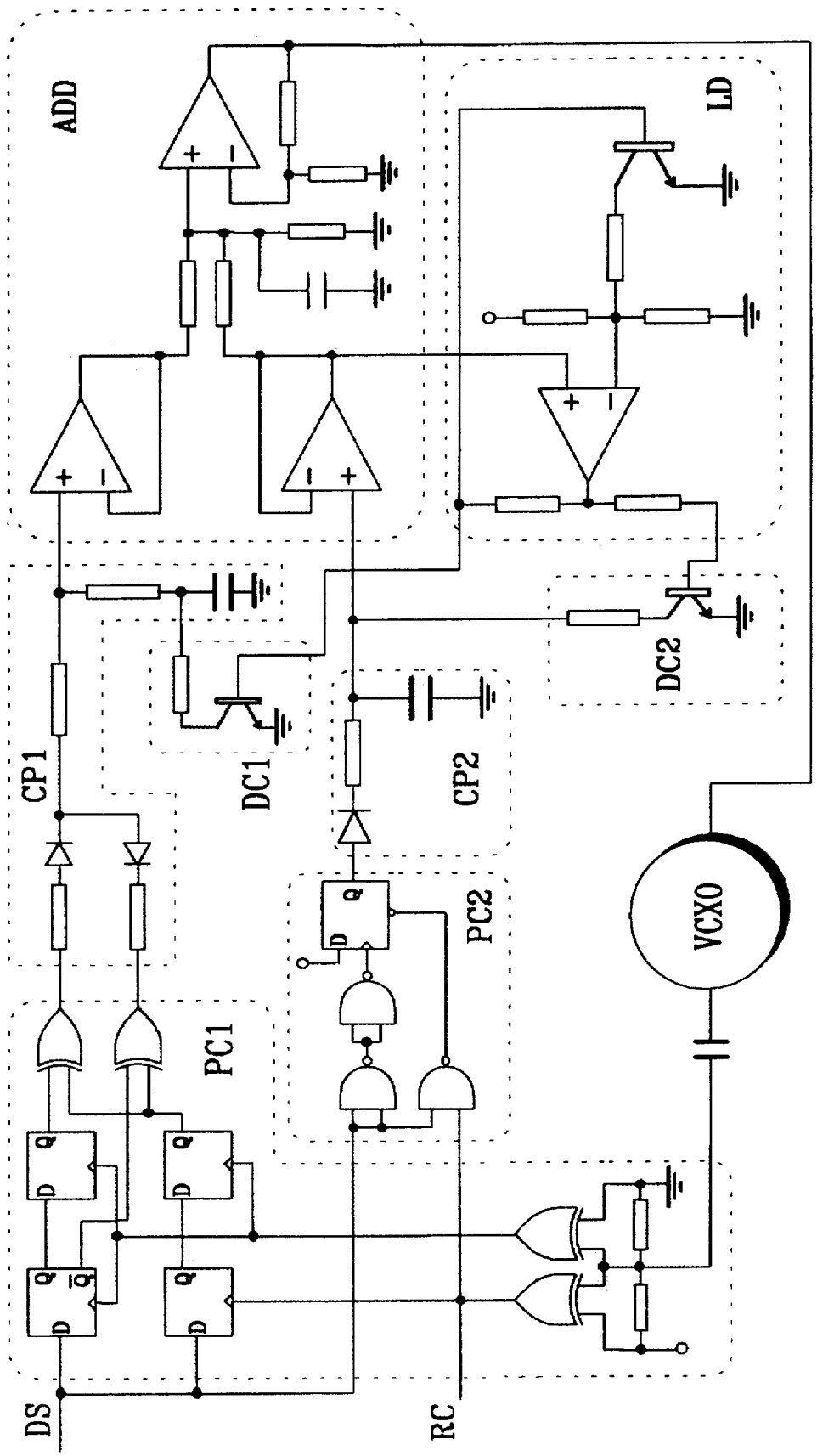
FIG. 6 shows a complete circuit of an implementation of the recovery circuit according to the invention.

Finally, FIG. 6 shows the detailed electric circuit diagram of the implementation made of the clock recovery circuit according to the invention.

The first phase comparator PC1, of a type that is very common in digital PLLs, receives the incoming data signal DS and the recovered clock signal RC and generates at its output two signals the high and low levels of which, respectively, have the same duration in the event that the signals applied to its input maintain a constant phase relationship. This first phase comparator PC1 requires the upright and inverted clock signals, for which reason the clock signal coming from the voltage-controlled oscillator VCXO is applied to one of the inputs of two identical exclusive-OR gates, the other input being a logical "1" and "0", respectively.

The first charge pump CP1, gradually charges and discharges its capacitor, depending on the times for which the outputs of the first phase comparator PC1 remain high and low, respectively. In the event that the PLL is locked in, the charge mentioned remains constant.

The adder circuit ADD is formed by two different operational amplifiers in a conventional arrangement for summing signals.

The false locking detector FLD is formed, as shown in FIG. 6, by a second phase comparator PC2 consisting of three NAND gates and a D-type bistable, and by a second charge pump CP2 formed by a diode, a resistor and a capacitor. In the event of a positive-going transition of the incoming data signal (RC) DS arriving at a moment other than when the clock signal applied to its input has a low level, a pulse is generated that slightly increases the charge on the capacitor of the second charge pump CP2. The output signal from this second charge pump CP2 is applied to the adder ADD.

The increase in voltage that is applied to the voltage-controlled oscillator VCXO via the false locking detector FLD pulls the PLL out of its locked state, making it immediately seek a new frequency that satisfies the loop equations.

The clock recovery circuit also has, as already mentioned, the first and second discharge circuits DC1, DC2 which discharge the capacitors included in the first and second charge pumps CP1, CP2 when the output voltage of the second charge pump CP2 reaches a preset value of 2.5 V. In this way the loop is reset and recommences the locking process starting with the initial conditions. This is necessary because the second charge pump CP2 only supplies current in one direction and cannot reduce its output voltage spontaneously. Otherwise the loop would saturate and would never be able to lock in.

The level detector LD is formed by a differential amplifier which receives, at one of its inputs, the voltage produced by the second charge pump CP2 and, at the other, the 2.5 V reference voltage. When the output voltage from this second charge pump CP2 attains this voltage, and in order to avoid the negative feedback produced through the second discharge circuit, the reference voltage is also reduced sharply through a resistor and a transistor which comes into conduction between the resistor mentioned and ground. In this way a comparator with hysteresis is formed which avoids output signal switching when the input voltage applied to its non-inverting input is close to the reference voltage.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

I claim:

1. Clock recovery circuit for an incoming data signal (DS) comprising a first phase locked loop (PC1, CP1, VCXO) comprising a first charge pump (CP1) having an output voltage which increases or decreases depending on output pulses from a first phase comparator (PC1), characterized in that a voltage-controlled oscillator (VCXO) of the first phase locked loop receives a signal coming from a false locking detector (FLD) which, in turn, receives the incoming data signal (DS) and a signal derived from an output of the voltage-controlled oscillator (VCXO), the false locking detector (FLD) comprising a second phase comparator (PC2) and a second charge pump (CP2) having an output signal for summation with said output voltage of the first charge pump (CP1) for control of the voltage-controlled oscillator (VCXO).

2. Clock recovery circuit according to claim 1, characterized in that it also has discharge circuits (DC1, DC2) which discharge, respectively, capacitors of the first and second charge pumps (CP1, CP2) when the output signal from the second charge pump (CP2) reaches a determined value.

3. Clock recovery circuit according to claim 1, characterized in that the output signal from the second phase comparator (PC2) of the false locking detector (FLD) adopts a high level when a difference in times between transitions of the data signal and activating edges of a recovered data clock signal exceeds a determined value.

* * * * *